United States Patent [19]

Brueck et al.

[11] Patent Number: 5,705,321

[45] Date of Patent: *Jan. 6, 1998

[54] METHOD FOR MANUFACTURE OF QUANTUM SIZED PERIODIC STRUCTURES IN SI MATERIALS

[75] Inventors: Steven R. J. Brueck; An-Shyang Chu; Bruce L. Draper; Saleem H. Zaidi, all of Albuquerque, N. Mex.

[73] Assignee: The University of New Mexico, Albuquerque, N. Mex.

[*] Notice: The term of this patent shall not extend beyond the expiration date of Pat. No. 5,415,835.

[21] Appl. No.: 490,101

[22] Filed: Jun. 6, 1995

Related U.S. Application Data

[63] Continuation of Ser. No. 123,543, Sep. 30, 1993, abandoned.

[51] Int. Cl.⁶ .................................................. G03C 5/00
[52] U.S. Cl. ......................... 430/316; 430/317; 430/323; 430/8; 430/394; 430/397
[58] Field of Search ................................ 430/316, 317, 430/323, 8, 394, 397

[56] References Cited

U.S. PATENT DOCUMENTS

| | | | |
|---|---|---|---|
| 4,402,571 | 9/1983 | Cowan et al. | 430/1 |
| 4,826,564 | 5/1989 | Desilets et al. | 430/314 |
| 4,859,548 | 8/1989 | Heise et al. | 430/394 |
| 4,916,002 | 4/1990 | Carver | 156/647 |
| 5,415,835 | 5/1995 | Brueck et al. | 430/311 |

OTHER PUBLICATIONS

E. Kapon, et al, *Quantum Wire Heterostructures for Optoelectronic Applications, Superlattices and Microstructures*, vol. 12, No. 4, 1992, pp. 491–499.

C. G. Smith and H. Ahmed, *Fabrication and phonon transport studies in nanometer scale free-standing wires*, J. Vac. Sci. Technol. Jan./Feb. 1987, pp. 314–317.

Harvey I. Liu, et al., *Oxidation of sub–50 nm Si columns for light emission study*, J. Vac. Sci. Technol. Nov./Dec. 1992, pp. 2846–2850.

William L. Wilson, P.F. Szajowski, L.E. Brus, *Quantum Confinements in Size–Selected, Surface–Oxidized Silicon Nanocrystals*, Science, vol. 262, 19 Nov. 1993, pp. 1242–1244.

*Shine On, Holey Silicon Already famous for its way with electrons, silicon now shows a tantalizing grace with photons* Science, May 1991, pp. 922–923.

A. Potts, D. G. Hasko, J.R.A. Cleaver, and H. Ahmed, *Fabrication of free–standing single–crystal silicon wires*, Appl. Phys. Lett 52 (10, 7 Mar. 1988, pp. 834–835.

*Primary Examiner*—Mark Chapman
*Attorney, Agent, or Firm*—Snell & Wilmer LLP

[57] ABSTRACT

Multiple-exposure fine-line interferometric lithography, combined with conventional optical lithography, is used in a sequence of steps to define arrays of complex, nm-scale structures in a photoresist layer. Nonlinearities in the develop, mask etch, and Si etch processes are used to modify the characteristics and further reduce the scale of the structures. Local curvature dependent oxidation provides an additional flexibility. Electrical contact to the quantum structures is achieved. Uniform arrays of Si structures, including quantum wires and quantum dots, are produced that have structure dimensions on the scale of electronic wave functions. Applications include enhanced optical interactions with quantum structured Si, including optical emission and lasing and novel electronic devices based on the fundamentally altered electronic properties of these materials. All of the process sequences involve parallel processing steps to make large fields of these quantum structures. The processes are, further, consistent with modern micro lithographic manufacturing practice, promising inexpensive and large-scale manufacture.

14 Claims, 9 Drawing Sheets

METHOD FOR MANUFACTURE OF QUANTUM SIZED PERIODIC STRUCTURES IN SI MATERIALS

This application continuation of application Ser. No. 08/123,543 filed Sep. 20, 1993, now abandoned which is related to copending application Ser. No. 07/945,776 now U.S. Pat. No. 5,415,835 filed Sep. 16, 1992, entitled "Method and Apparatus for Fine-line Interferometric Lithography" by inventors Steven R. J. Brueck, An-Shyang Chu, and Saleem Zaidi (attorney docket number UNM-346). This application is incorporated herein by this reference.

BACKGROUND

Semiconductor quantum structures are physical structures with dimensions on the order of electronic wavefunctions. The most familiar examples are the quantum wells common in semiconductor laser structures, e.g., a thin GaAs layer sandwiched between two larger bandgap AlGaAs layers. As a result of the band offsets characteristic of these two materials, both electrons and holes are confined to the thin GaAs layer. As the thickness of this layer is reduced to less than the de-Broglie wavelength of the electron, on the order of 30 nm, the electronic wavefunctions are modified. This results both in slight increases in the electronic energy levels and, importantly, in a significant increase in the electronic density-of-states at the edges of the conduction and valence bands. These increases in the density-of-states are a major reason for the advantages of quantum wells over bulk material in laser structures. For example, because of both spatial and momentum localization of the carriers, a lower pumping density is required to achieve gain and lasing threshold in a quantum well structure than in a bulk material.

Quantum wires and quantum boxes are the two and three dimensional extensions of quantum wells, respectively. There are further increases in the band edge densities of states that accompany each increase in quantum dimensionality. For quantum boxes, in fact, there is no longer a band; in some sense, a quantum box is a man-made atom! Because of both the intrinsic interest in quantum phenomena and of the technological advantages, there have been significant efforts at achieving quantum structures and devices such as lasers based on the properties of these structures. While it is possible to form sufficiently small structures in GaAs and other III-V materials by various processing techniques, usually predicated on advanced, high-resolution lithographies such as e-beam and focused ion-beam, these efforts have been hindered by the poor qualities of the III-V interfaces with other materials (vacuum, $SiO_2$, etc.) and by the damage associated with the aggressive lithography and etch processes. In addition, these lithographies are better suited to one-of-a-kind structures than to large-scale high yield manufacturing. These approaches are thus more suited to laboratory investigations available to only a very limited number of investigators with the necessary (and expensive) equipment. Another approach has been to take advantage of the crystallographically dependent growth properties that occur when growing on patterned structures (V-grooves, mesas, etc.). Under the right growth conditions, narrow quantum wire structures will form at edges (bottom of the V-groove, corner of a mesa, etc.). Here, it is difficult to control the dimensions of the quantum structures to be sufficiently small; the growth often occurs on relatively poor quality material (i.e., there are more imperfections at edges); and it is difficult to fabricate dense arrays of uniform quantum structures. Largely for these reasons, the demonstration of quantum wire lasers remains a tour-de-force experiment rather than a repeatable manufacturable process.

Recently, there has been much interest in the properties of quantum structures in Si following the observation of efficient, visible-wavelength photoemission from porous Si materials. Si has an indirect bandgap and, in general, has weaker interactions with electromagnetic fields than do III-V compounds. The mechanism for this emission is still under investigation with two major theories being proposed: 1) quantum structure effects due to the very small, less than 50 nm, wire-like structures found in porous Si, and 2) surface effects due to loss of crystal structure and chemical bonding (variously determined to be $SiH_2$ and SiOH species) at the porous Si surface. There also have been observations of electrically-pumped emission, particularly during electrochemical reactions forming the porous Si.

Because of the overwhelmingly dominant use of Si for microelectronic devices and circuits and the compelling economic advantages that would accrue to the development of a Si optoelectronic technology that was compatible with and could be integrated into Si microelectronics, there has been much interest in pursuing a Si-based alternative to electrically produced optical emission (light-emitting diodes) and perhaps even lasing. Optical interconnections are an intensively investigated application of optoelectronics to high-performance computers that are widely thought to offer a performance advantage in the relatively near term—but only if they can be cost effectively integrated with the Si microelectronics. The availability of Si-based optical sources would make this a much more attractive alternative. Electrical devices and circuits as well might benefit from the capability of manufacturing Si quantum structures offering a new realm of electronic material properties that differ dramatically from bulk materials.

For the foregoing reasons, there is a need for a method to fabricate quantum-sized structures in Si material that is inexpensive and applicable to high yield manufacturing processes.

SUMMARY

The present invention is directed toward a method that will enable the manufacture of dense arrays of uniform quantum-sized structures in Si material with application to microelectronic devices and potentially to Si light emitters. As used here, the word manufacture refers to a series of processes that are capable of cost effective production of quantum structures in a parallel process and at sufficient throughputs, uniformity, and volumes that thousands or more of such structure arrays can be produced with roughly comparable ease as existing microelectronic fabrication practice. Fine-line interferometric lithography techniques are combined with nonlinearities in the develop, etch, and subsequent processes (such as oxidation) to produce these results. The method comprises the steps of sequentially depositing thin etch mask and photoresist layers on a Si substrate. The photoresist layer is then exposed to a single or multiple periodic pattern of lines with submicron dimensions, possibly combined with conventional lithography steps to define areas on a scale large compared with quantum structure dimensions. The fine-line lithography technique is adjusted to yield the optimal dimension (0.05–0.25 μm) of resist exposure for the remainder of the processing. These dimensions are less than the approximate 0.35-μm scale that can be achieved today with conventional lithography techniques. Following exposure, the resist is developed to remove the exposed resist and the developed photoresist pattern is transferred into the etch mask by a conventional etching (wet and dry processes have been used) process leaving exposed areas of the Si substrate. Use of an isotropic etch process allows undercutting of the photoresist mask to further reduce the linewidths of the etch mask. The remaining photoresist is then removed. Next, the regions of the exposed Si substrate are etched with a highly anisotropic etching process. In the preferred implementation of the invention, this etch process is a KOH wet etch which preferentially etches the {110} Si and other crystal faces at a much higher rate than the {111} crystal faces. This leaves very high aspect ratio, narrow Si walls whose width can approach quantum dimensions. Wall thicknesses of less than 40 nm have been produced. An important aspect of this anisotropic etching process is that the unique selectivity of the {111} crystal faces reduces the roughness remaining from the lithography and etch processes and results in almost atomically perfect sidewalls. The Si walls can then be oxidized, consuming Si, to the point where the middle region of the Si walls is completely eliminated, isolating the upper region of the Si walls from the substrate using the local curvature-dependent oxidation-rate property of Si, thereby forming single-crystal Si quantum wires in the upper region. Portions of the Si wafer can be doped prior to fabrication, such that regions showing rapid changes in doping are contained within the quantum wires to form microelectronic circuit components on a quantum scale. By the use of multiple fine-line lithography exposures of the photoresist or by integrating conventional lithography techniques on the same level of photoresist, the arrays of quantum-wire-like structures may be connected to "buss-bars" that run perpendicular to the wires, allowing for electrical contact to the quantum-wire structures. This will enable the manipulation of carriers similar to that practiced in conventionally-sized lasers, light-emitting diode and field-effect transistor structures. In general, the use of multiple-exposure interferometric lithography and/or combining interferometric lithography with conventional optical lithography either during the photoresist exposure step or within multiple iterations of portions of the process results in the manufacture of a wide range of complex quantum-sized structures, including quantum "dots" and quantum "pearls."

DRAWINGS

These and other features, aspects, and advantages of the present invention will become better understood with regard to the following description, appended claims, and accompanying drawings where:

FIGS. 1A–H shows the fabrication sequence used to make quantum-sized Si structures on <110> oriented substrates.

Figure 9:
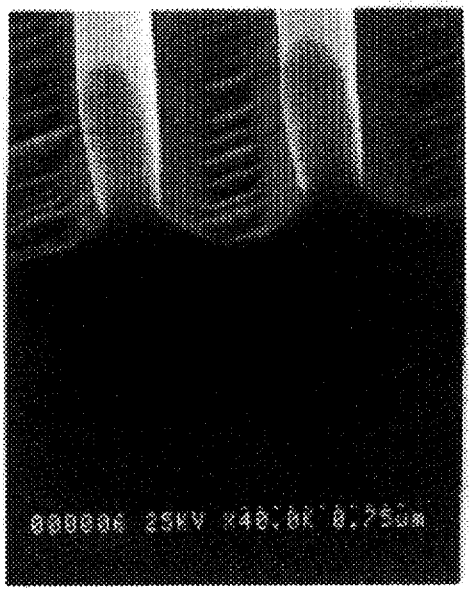
FIG. 9 is a SEM of a structure similar to that of FIG. 7 where the oxidation was extended to the point that the middle region of the Si was pinched off by the oxide leaving a single-crystal Si quantum wire in the upper region.
Figure 10A:
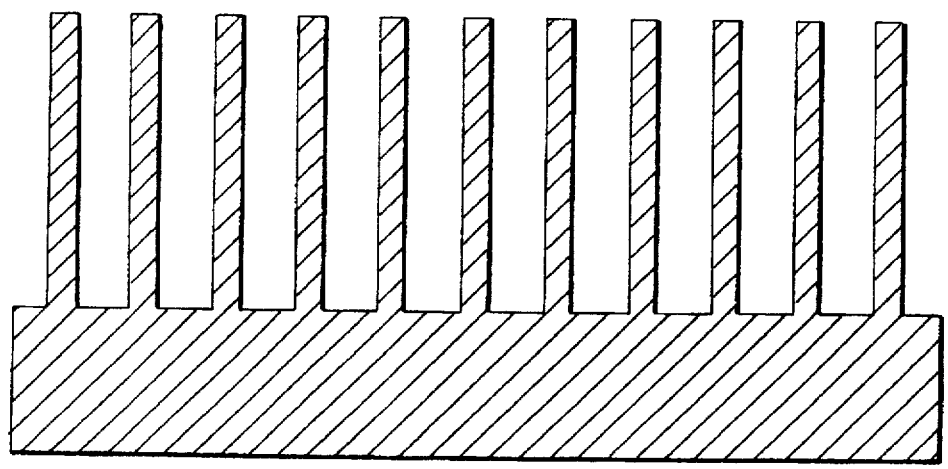
Figure 10B:
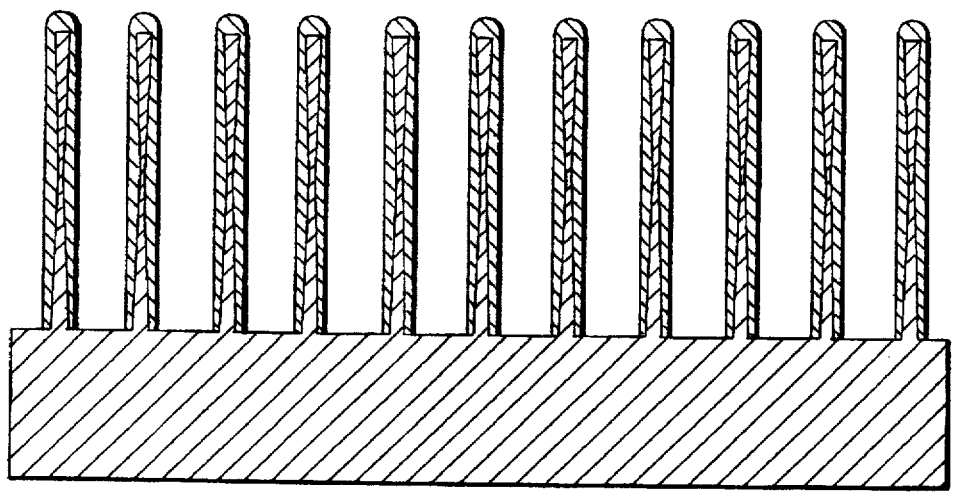
Figure 10C:
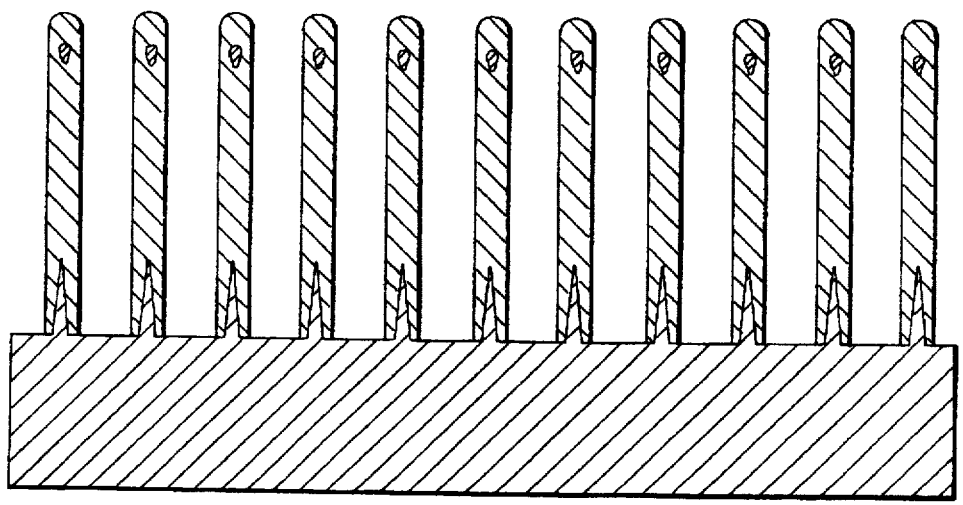

FIGS. 10A–C are diagrams of FIG. 9 to better show the quantum wire structure.

Figure 11:
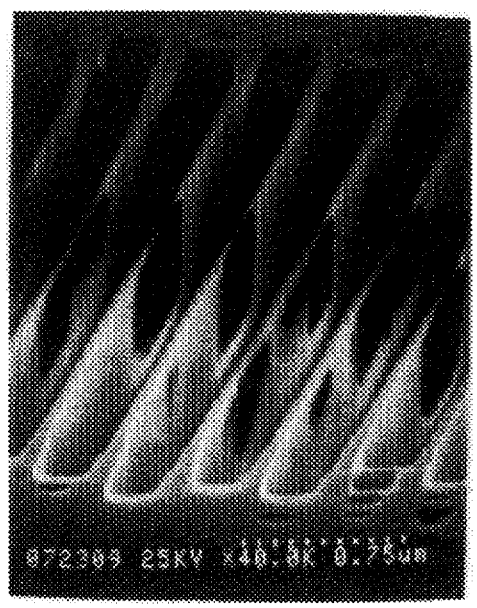

FIG. 11 is a SEM of a series of quantum wires connected to a buss-bar at the lower end fabricated with a multiple exposure interferometric lithography technique.

Figure 12:
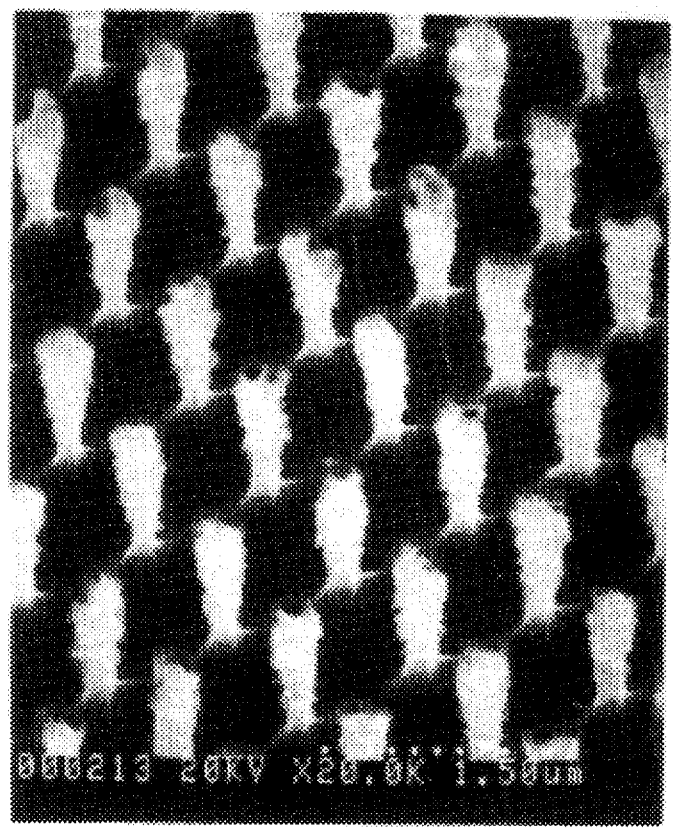

FIG. 12 is an example of isolated posts fabricated by a multiple exposure technique.

Figure 13:
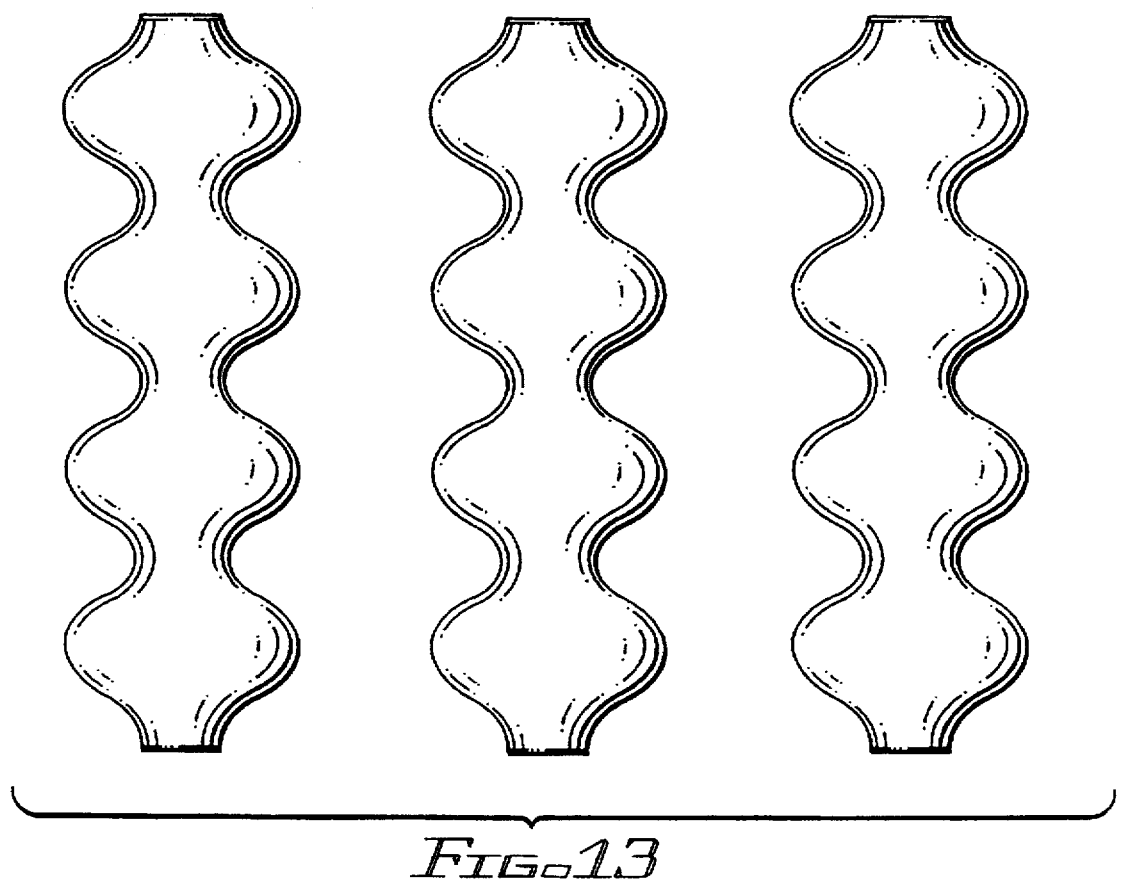

FIG. 13 is a string of "quantum pearl" structures.

DESCRIPTION

A process according to the present invention for fabricating quantum-sized, complex, two-dimensional periodic structures in silicon materials comprises the steps of depositing a thin etch mask layer on a Si substrate (wafer); then depositing a thin photoresist layer on top of the etch mask layer. The photoresist layer is then exposed to a periodic pattern of lines using fine-line interferometric lithography optimized to yield the appropriate sub-micron dimension of unexposed photoresist. The photoresist is developed to remove the exposed photoresist. The photoresist pattern is next transferred into the etch mask using an etching process; over etching the etch mask at this point will undercut the etch mask and further narrow the etch mask pattern. The remaining photoresist is then removed. A highly anisotropic etching process such as KOH can be used to etch the exposed Si substrate, in which case the lines of the periodic pattern should be aligned with the {111} Si directions prior to photoresist exposure. In this process the {111} Si faces are almost totally unetched, and thereby leave very narrow, quantum-sized Si walls with a very high aspect ratio. If reactive ion or ion milling etch processes are used at the stage, however, instead of KOH, it is not necessary to pre-align the pattern with the {111} Si directions. The remaining etch mask is then removed, leaving an all Si structure. This structure is then oxidized to the point where the middle region of the Si walls is isolated from the upper region of the Si walls using the local curvature-dependent oxidation property of Si, thereby forming single-crystal Si quantum-sized wires in the upper region. The Si substrate can be doped prior to fabrication such that regions showing rapid changes in doping are contained within the quantum wires thus formed. The same basic method can be used to fabricate more complex quantum-sized structures by the use of multiple-exposure interferometric lithography and/or combining interferometric lithography with conventional optical lithography either during the photoresist exposure step or within multiple iterations of portions of the process.

Figure 1A:
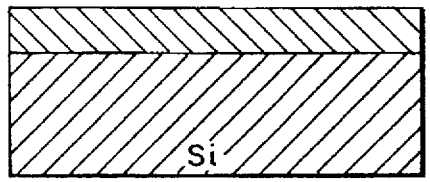
Figure 1E:
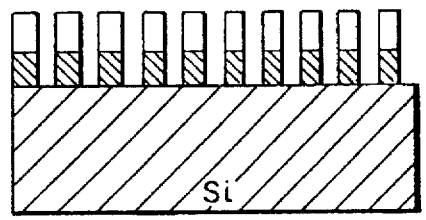
Figure 1B:
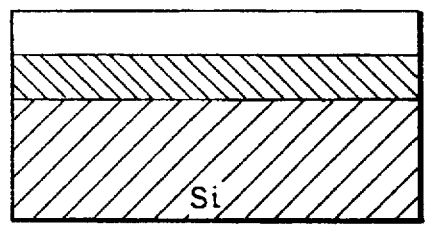
Figure 1F:
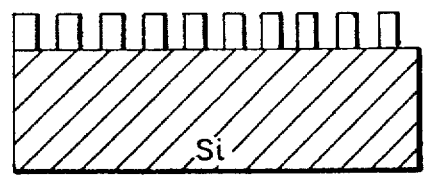
Figure 1C:
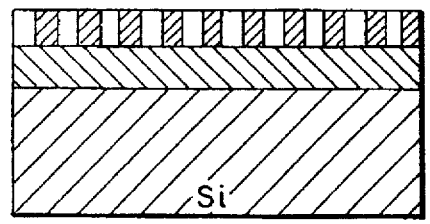
Figure 1G:
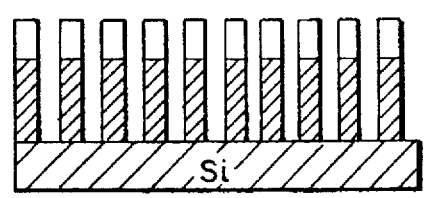
Figure 1D:
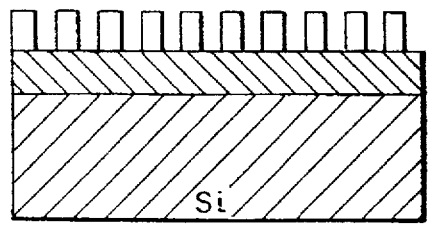
Figure 1H:
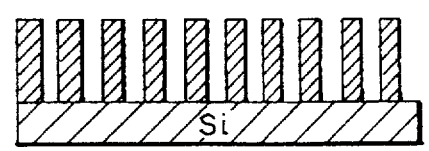
Figure 2:
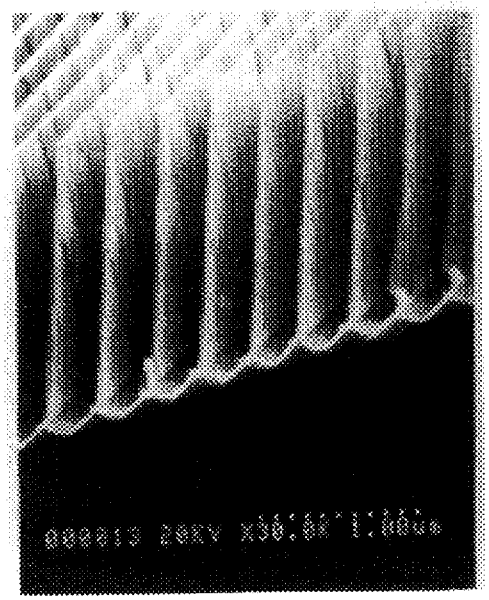
FIG. 2 shows a scanning electron micrograph (SEM) of Si walls that are 40-nm wide, with a 340-nm period.

FIGS. 1A–H show the fabrication sequence used in one embodiment of the present invention to make very thin (to 30 nm or thinner) Si structures on a bulk (110) oriented crystalline-Si substrate or wafer. In the first step a thin $Si_3N_4$ (10–200 nm) layer is deposited on the Si wafer by any of a variety of well-known processes, such as a low-pressure chemical vapor deposition process. The film must be thick enough to provide a pinhole-free etch barrier for subsequent processing and sufficiently thin to accurately register the extreme submicron dimensions. The purpose of this nitride layer is to serve as an etch mask for later process steps. Materials for the etch mask might be $Si_3N_4$, $SiO_2$, or tungsten. A thin photoresist layer is then deposited by standard methods on top of the $Si_3N_4$. The photoresist layer is less than $\lambda/2$ n thick, where $\lambda$ is the wavelength of the exposing radiation and "n" is refractive index of the photoresist at wavelength $\lambda$. The photoresist might typically be 150 to 200 nm thick and is chosen to minimize the vertical standing waves that form with a thicker photoresist under coherent radiation. This photosensitive layer is exposed using the fine-line interferometric lithography technique in which the exposure dose is optimized to achieve the appropriate sub-micron dimension of unexposed resist. In this embodiment, the KOH etching process described below was used. Particular care must be taken to align the grating lines of the interferometric lithography pattern along the {111} crystal planes in order to achieve a high aspect ratio. A photoresist development process, optimized to yield narrow linewidths, is then employed to remove the exposed photoresist. Linewidths of 100 nm or less are readily achievable in this way. A plasma etch process ($CF_4$ etchant in this embodiment) is then used to etch through the $Si_3N_4$ layer. The F and other radicals that result from the plasma discharge in $CF_4$ are isotropic etchants and will attack the nitride mask under the photoresist layers as well as the bare Si in the exposed areas. Overetching may be used as a nonlinear step to further narrow the lines. The photoresist, which serves as the etch mask during this first etch process is then removed leaving an $Si_3N_4$ mask. Next the regions of exposed Si substrate are etched with a highly anisotropic etch process. For the present embodiment a KOH wet etch step was used. KOH is a highly anisotropic etchant which leaves the {111} Si faces almost totally unetched while rapidly etching the {110} and {100} and other crystallographic directions. The strong selectivity of the KOH wet etch (~400:1 {110}:{111}) leads to very high-aspect ratio (as much as 50:1 or higher) and very narrow Si walls. These are illustrated in FIG. 2 which is a scanning electron micrograph (SEM) of 40-nm wide, 2-μm deep, Si walls with a 340-nm period. The sidewalls of these structures are {111} crystal faces and are perpendicular to the top <110> orientation. Due to the high anisotropy of the etching process, imperfections in the photoresist profile due to molecular inhomogeneities, optical artifacts, inhomogeneous development, etc., are dramatically reduced during this KOH etching. Indeed, the dark lines on the sidewalls running off at an angle to the vertical direction are steps corresponding to another low etch-rate crystalline direction. Alternately, other anisotropic etching processes such as reactive-ion etching or ion-milling may be used at this point in the fabrication. Finally, the silicon nitride cap layer can be simply etched off with dilute HF to leave an all Si structure. These structures are similar to quantum wells in that they have one dimension on the order of carder wavefunctions. Most often quantum wells are fabricated by an epitaxial growth technique that is practically limited to a total growth thicknesses on the order of 10 μm. This technique provides a new method of producing quantum size structures in Si materials. Similar to conventional microelectronic practice, all of the processing involved is parallel in that a whole field of many structures is exposed, etched, etc. at each step. The field size is limited only at the exposure step by the available laser power and coherence. Field sizes as large as 10×10 cm² or larger are feasible. Thus, much larger arrays of quantum structures can be fabricated by this technique than are possible by traditional growth techniques.

Figure 3:
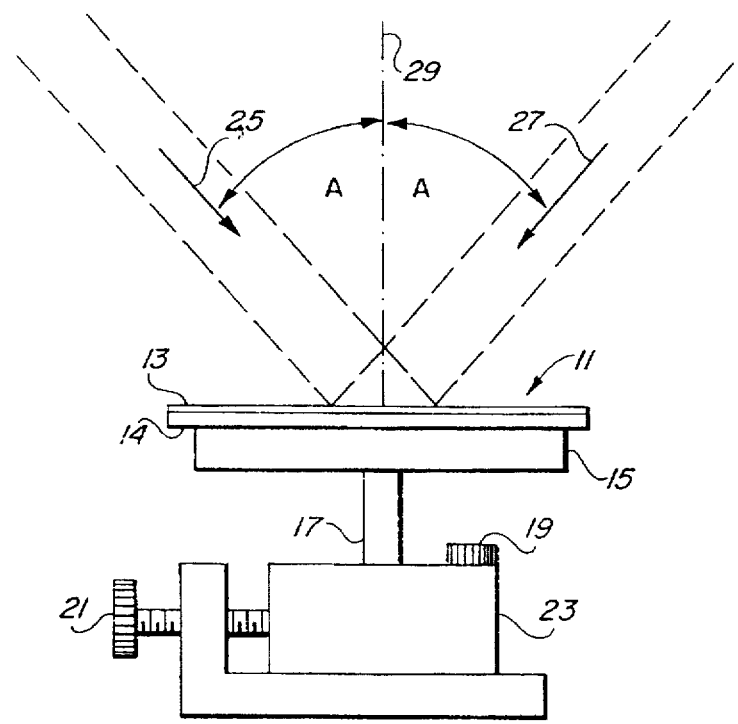
FIGS. 3 and 4 are diagrammatic views of alternative versions of apparatus employed in the fine-line interferometric lithography technique to expose the photoresist.
Figure 4:
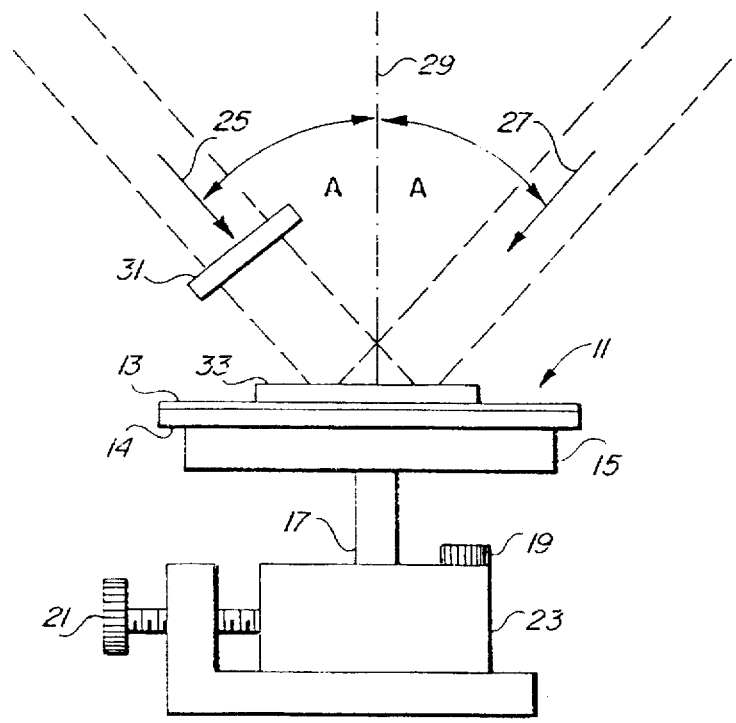

FIGS. 3 and 4 are diagrammatic views of alternative versions of the apparatus employed to expose the photoresist using the fine-line interferometric technique. This technique is the subject U.S. Pat. No. 5,415,835 filed on Sep. 16, 1992 and is also discussed in Zaidi, S. H. and S. R. J. Brueck, "Multiple-exposure Interferometric Lithography," J. Vac. Sci. Technol. B 11(3), May/June 1993, pp. 658–666. Referring to FIGS. 3 and 4, a wafer 11 having a photosensitive layer 13 and substrate 14 is positioned on a movable table 15. The table 15 is supported on a shaft 17 and is arranged to be rotated and translated in two-dimensions respectively via controls 19 and 21 which control mechanical rotational and translational motion producing motors and linkages generally indicated by the numeral 23 and being of any suitable well known construction.

Coherent optical beams 25 and 27 provided by any suitable well known source or sources are directed at a variable angle A from the vertical or system axis 29 toward each other and toward the photoresist layer 13 to form an interference pattern on the photosensitive layer 13. The arrangement shown in FIG. 4 is identical to that of FIG. 3 with the addition of a phase-amplitude mask 31 in the path of beam 25 or a phase-amplitude mask 33 in the path of both beams 25 and 27 in their interference region at the surface of the photosensitive layer 13, or both. The beams 25 and 27 of coherent radiation may be lasers and may be provided in any suitable well known manner so that they are from the same source and are essentially equal in intensity at the wafer which assures a high contrast exposure.

The complex interference pattern produced on the photoresist layer or layers is varied by (a) rotating the substrate, (b) translating the substrate, (c) both rotating and translating the substrate, (d) changing the angle A, (e) varying the number of exposures, (f) varying the optical intensity, (g) using a phase-amplitude mask in one or both illuminating beams of coherent radiation, or (h) employing any combination of (a)–(g). Further flexibility is offered by a combination of any of (a)–(g) with conventional optical imaging lithography techniques as are well known.

A single or multiple set of interferometric exposures are carried out in the photoresist layer. The subsequent pattern is then developed and transferred to the etch mask. The substrate may then be re-coated with a photoresist layer, and single or multiple exposure processes may be repeated to obtain the desired complex two-dimensional pattern.

U.S. Pat. No. 5,415,835 provides complex, two-dimensional patterns in integrated circuits through the use of multiple grating exposures on the same or different photoresist layers and the use of complex amplitude and phase masks in one or both of the beams of illuminating coherent radiation. ("Complex, two-dimensional patterns" as used herein means a pattern of multiple, interconnected and/or unconnected straight or curved lines or bodies spaced apart from each other. "Extreme submicron range" means distances of the order of 0.1 μm or 100 nm or less between lines.) Interferometric lithography may be combined with conventional lithography for the production of extreme submicrometer structures and the flexible interconnect technology necessary to produce useful structures. Generally, a critical dimension (CD) of the order of 60 nm with a pitch of 187 nm is obtainable through the process of the invention (U.S. Pat. No. 5,415,835). Although with the use of a KrF excimer laser at 248 nm, a pitch of 124 nm and a CD of 41 nm can be attained. Further extension to a ArF excimer laser at 193 nm will proportionately reduce these dimensions. In general, as laser technology continues to evolve and results in shorter wavelength coherent sources, this technique can be adapted to produce still smaller structures.

Referring to FIGS. 3 and 4, a wafer 11 having a photosensitive layer 13 and substrate 14 is positioned on a movable table 15. The table 15 is supported on a shaft 17 and is arranged to be rotated and translated in two-dimensions respectively via controls 19 and 21 which control mechanical rotational and translational motion producing motors and linkages generally indicated by the numeral 23. The motors and linkages 23 and controls 19 and 21 need not be shown in detail since they are well known in the art and may be of any suitable well known construction.

Coherent optical beams 25 and 27 provided by any suitable well known source or sources are directed at a variable angle A from the vertical or system axis 29 toward each other and toward the photoresist layer 13 to form an interference pattern on the photosensitive layer 13. The arrangement shown in FIG. 4 is identical to that of FIG. 3 with the addition of a phase-amplitude mask 31 in the path of beam 25 or a phase-amplitude mask 33 in the path of both beams 25 and 27 in their interference region at the surface of the photobooth. The layer 13, or both. The beams 25 and 27 of coherent radiation may be lasers and may be provided in any suitable well known manner so that they are from the same source and are essentially equal in intensity at the wafer which assures a high contrast exposure.

In accordance with the invention the complex interference pattern produced on the photoresist layer or layers is varied by (a) rotating the wafer, (b) translating the wafer, (c) both rotating and translating the wafer, (d) changing the angle A, (e) varying the number of exposures, (f) varying the optical intensity, (g) using a phase/amplitude mask in one or both illuminating to beams of coherent radiation, or (h) employing any combination of (a)–(g). Further flexibility is offered by a combination of any of (a)–(g) with conventional or imaging lithography techniques as are well known.

As an alternative method, first a single or multiple set of interferometric exposures are carried out in photosensitive layer. The subsequent pattern is then developed and transferred to a semiconductor substrate by any of the well known commercially available techniques. This substrate is then again recoated with a photoresistive layer, and single or multiple exposure processes can be repeated with the aid of the alignment position sensing arrangement described in Brueck, et al., in U.S. Pat. No. 4,987,461.

Except for the arrangement of U.S. Pat. No. 5,415,835, no other technique exists that can be used to economically fabricate these interleaved structures over very large areas with extreme submicrometer dimensions. These structures are also useful for high-speed optical detectors where the transmit times across the submicrometer gap determines the detector speed. Indeed, this interdigitated structure is commonly used for a wide array of sensors. The capability provided by interferometric lithography of this invention will enhance the functionality of many of these devices.

Specifically, the "fine-line interferometric lithography" technique referred to in the present application is defined by the claims of U.S. Pat. No. 5,415,835, to wit:

1. In microelectronic processing, the method of producing a two-dimensional complex pattern on a photosensitive layer said pattern containing structures with dimensions in the extreme submicron range, comprising the steps of:
   a) exposing the photosensitive layer for a first time to two beams of coherent radiation which form an image of a first interference pattern on the surface of said layer;
   b) exposing the photosensitive layer for at least one subsequent time to two beams of coherent radiation which form an image of at least one subsequent interference pattern, such that said subsequent interference pattern or patterns referenced to the photosensitive layer are each different from the first pattern;
   c) isolating desired regions of said complex pattern with a further exposure of the photosensitive layer using any conventional lithography to expose all the regions in which the pattern is to be retained.

2. The method of claim 1 wherein the photosensitive layer is rotated between exposures such that each subsequent interference pattern differs in rotational orientation relative to said first interference pattern.

3. The method of claim 1 wherein the photosensitive layer is translated between exposures such that each subsequent interference pattern is offset from said first interference pattern.

4. The method of claim 1 wherein the photosensitive layer is both rotated and translated between exposures such that each subsequent interference pattern differs from said first interference pattern in both rotational orientation and in translational position.

5. The method of claim 1 wherein at least one of said beams of the second or subsequent exposures of the photosensitive layer is varied in amplitude such that each subsequent interference pattern differs from said first interference pattern.

6. The method of claim 1 wherein at least one of said beams of the second or subsequent exposures of the photosensitive layer is varied in phase such that each subsequent interference pattern differs from said first interference pattern.

7. The method of claim 1 wherein at least one of said beams of the second or subsequent exposures of the photosensitive layer is varied in phase and amplitude such that each subsequent interference pattern differs from said first interference pattern.

8. The method of claim 1 wherein the periodicity of the interference pattern of at least one of said second or subsequent exposures of the photosensitive layer is varied such that each subsequent interference pattern differs from said first interference pattern.

Figure 5A:
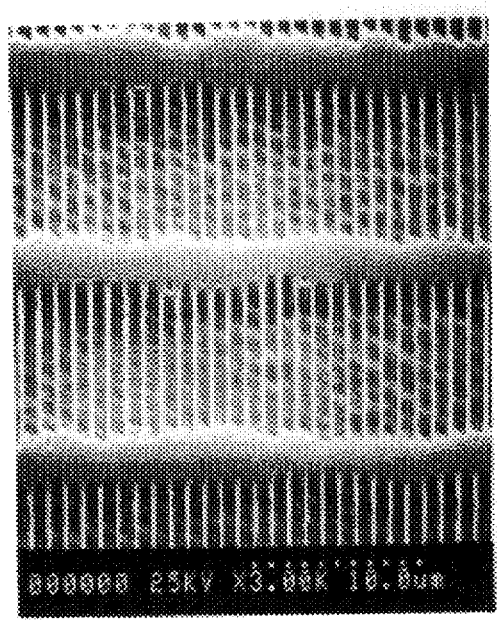
FIG. 5 shows two SEM views of an array of 50-nm wide Si quantum walls with a 0.5 µm pitch (period) and having "buss-bars" running perpendicular to the quantum structures spaced every 12 µm.
Figure 5B:
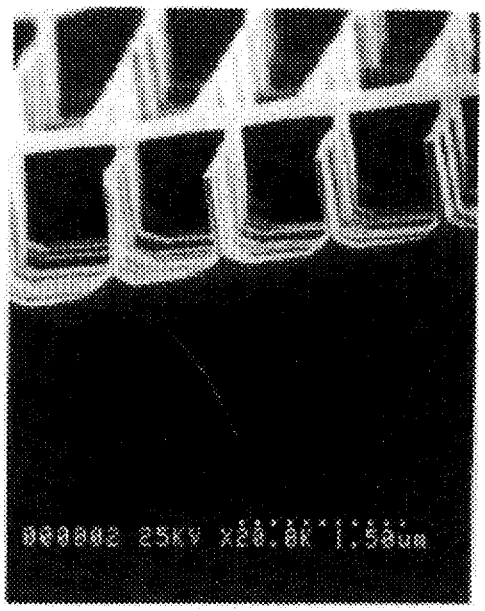

The use of multiple exposures to form more complex arrays of quantum structures is illustrated in FIG. 5. This shows an array of 50-nm wide Si quantum walls on a 0.5 μm pitch. The double exposure moiré pattern evident in the top view of the structure (right) was obtained with the very slight rotation of 1.2° between exposures. This results in the approximate 1-μm wide "buss-bars" running perpendicular to the quantum structures spaced every 12 μm. These "buss-bars" provide a convenient means of electrically contacting the quantum structures, a requirement for electrical excitation. It is possible, using well-known techniques, to provide a transverse p-n junction in the region between the "buss-bars." This would allow carrier injection in the region of the quantum wires with the upper and lower "buss-bars" alternately doped p and n type.

Figure 6:
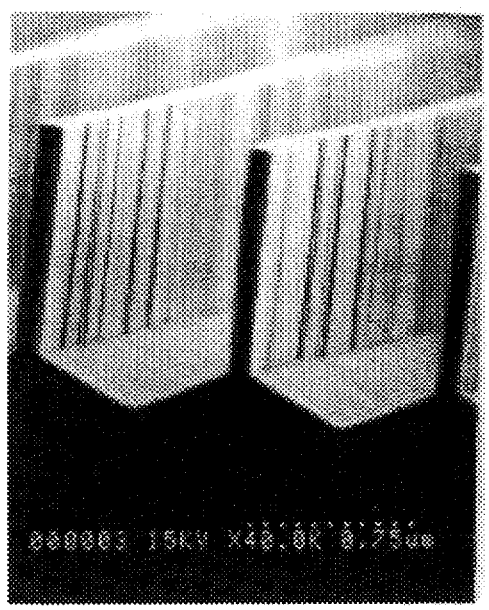
FIG. 6 shows a SEM of an array of Si structures with 120 nm wall thickness.
Figure 7:
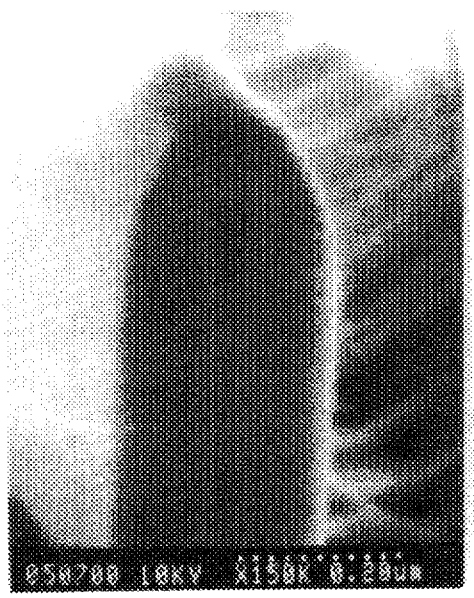
FIG. 7 shows a SEM of the structures of FIG. 6 after thermal oxidation with an oxidation thickness of approximately 70 nm from each side.
Figure 8:
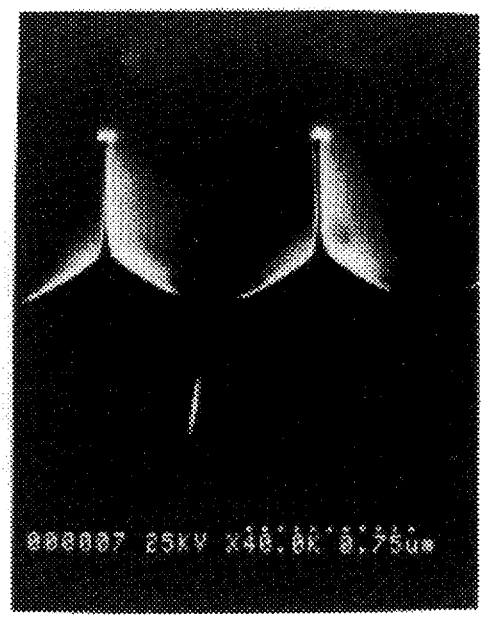
FIG. 8 shows the structures of FIG. 7 following an HF etch step to remove the SiO2 formed during the thermal oxidation step.

A further extension of these structures to quantum wires can be achieved by a thermal oxidation step. FIG. 6 shows a SEM of an array of Si structures similar to the quantum walls described earlier but somewhat wider than quantum dimensions (120 nm). FIG. 7 shows the results of a thermal oxidation of similar 150-nm wide structures with an oxidation thickness of approximately 70 nm from each side. The remaining Si is the darker material in the center of the structure, surrounded by $SiO_2$. The Si may be more easily visualized after an HF etch step to remove the $SiO_2$ formed during the oxidation. This is illustrated in the SEM of FIG. 8 which shows the resulting Si structure. The curved surfaces result from the local curvature dependent oxidation rates which are higher on the (initially) flat surfaces than on the sharply curved <110>–<1̄10> corners. This effect has been used previously to sharpen Si tips for scanning force microscopy and field-emitter tip applications. If the oxidation leading to FIG. 7 is further extended, the middle region of the Si is pinched off by conversion to oxide and a single-crystal Si quantum wire is formed in the upper region. This is illustrated in the SEM of FIG. 9 which shows the quantum wire as the slightly darker inverted triangle with dimensions of approximately 30×30 nm in the upper center of the oxide. Note that these quantum wires are formed of single crystal Si which can be doped by any of a number of well-known techniques prior to this fabrication. The quantum wire is completely surrounded by a thermal oxide which provides a superior passivation and isolation from the surroundings. FIGS. 10A–C are graphical representations of these various oxidation steps. The multiple exposure techniques provide means for electrical connection to arrays of these quantum wires as is illustrated in FIG. 11 which shows an array of quantum wires that have been isolated by oxidation and dipped in HF to etch off the oxide. In the center of the pictures, freely suspended wires are evident. At the bottom of the figure the connection to the buss-bar can be seen.

Several variations on the techniques disclosed herein can be used to manufacture arrays of quantum dots. Double grating exposures in the same level of photoresist with a 90° rotation between exposures provide a two-dimensional array of circular patterns. The periods of the pattern are chosen by the incident angles of the interfering laser beams, and the mesa dimensions are established by the exposure intensity and subsequent develop processes (including pre- and post-bake steps). This array of mesas can again be transferred into an etch mask as in the single exposure grating case and further etched into the Si using any well-known highly anistropic etch process such as reactive-ion etching or ion-milling. FIG. 12 shows an array of columnar structures formed by reactive-ion etching of GaAs material. The period is 0.8 μm ion both directions and the columns are 190 nm in diameter at the bottoms. The local curvature dependent oxidation may then be used in a manner analogous to that above to pinch off the resulting columns and form an array of quantum dots. To take advantage of the anisotropic KOH etching process, a somewhat different procedure is required. The anisotropic etching is selective to the relatively slowly etching {111} faces. There are two intersecting sets of {111} planes perpendicular to the <110> orientation that form a parallelepiped with an interior angle of 70.5°. One technique to form an array of such parallelepipeds with nm-dimensions in the etch mask layer is to etch a one-dimensional grating into the mask layer as above, to re-coat the wafer with a second photoresist layer to expose a second grating, rotated by 70.5° from the first grating followed by a second isotropic etch through the etch mask layer. Subsequent processing including KOH anisotropic etching and oxidation would follow the same pattern as for the quantum wires. Alternatively, the single grating process can be followed through the KOH etch before the wafer is re-coated with photoresist, re-exposed, re-etched, etc. These processes will need to be optimized depending on the specific structure desired. However, variations such as these in processing sequence and multiple applications of specific processing steps and sequences of steps are common and within the state-of-the-art in microelectronic processing.

Quantum dots fabricated as disclosed above will be electrically isolated. For many applications, it is desirable to maintain an electrical connectivity, even while gaining the advantages of three-dimensional quantum confinement. Structures providing this functionality are shown in FIG. 13. These are fabricated in a manner similar to that disclosed for quantum dots, with a double exposure in the same level of resist, with the variation that the second exposure is at a lower exposure fluence so that the circular patterns in the developed photoresist layer are not completely isolated but are connected with fine wire patterns. Subsequent processing is similar to that already disclosed. This will yield a string of "quantum pearls" that maintain the electrical connectivity.

More complex multiple exposure patterns will yield more complex initial photoresist patterns as taught in U.S. Pat. No. 5,415,835. Use of the nonlinear etch, oxidation, and other Si processing steps will allow the fabrication of very complex structures with dimensions in the quantum domain. Further levels of complexity can be achieved with the use of layered film structures such as Si:Ge layers grown epitaxially onto the Si, or the use of silicon-on-insulator material in place of the bulk Si.

The previously described versions of the present invention have many advantages, including the suitability to manufacturing of dense arrays of uniform nanometer-sized structures in Si material with application to microelectronic devices and potentially to Si light emitters.

The present invention is in no way restricted to the specific disclosure of the specifications and drawings, but also encompasses any modifications within the scope of the appended claims.

What is claimed is:

1. In microelectronic processing, the method of fabricating complex two-dimensional quantum-size (less than 30 nanometer) periodic structures in Si materials, the method comprising the steps of:
   a. depositing a thin etch mask layer on a Si substrate;
   b. depositing a thin photoresist layer on top of the etch mask layer;
   c. exposing the photoresist layer with a periodic pattern using a fine-line interferometric lithography technique optimized to yield the appropriate sub-micron dimension of unexposed photoresist;
   d. developing the photoresist to remove the exposed photoresist;
   e. etching through the etch mask, whereby the developed photoresist pattern is transferred into the etch mask;
   f. removing the remaining photoresist;
   g. repeating steps b. through f. as required by multiple exposures using the fine-line interferometric lithography technique to obtain the desired pattern;
   h. etching the Si substrate with a highly anisotropic etching process, thereby leaving a quantum sized Si structure;
   i. repeating steps b. through f. as required to obtain the desired pattern;
   j. etching off the remaining etch mask layer, thereby leaving an all Si structure;
   k. repeating steps a. through j as required to obtain the desired pattern.

2. The method of claim 1 wherein said etch mask layer of step a. comprises $Si_3N_4$, $SiO_2$, or tungsten.

3. The method of claim 2 wherein the etchant of step e. consists of a $CF_4$ plasma etch process.

4. The method of claim 3 wherein the etching process of step e. is over etched so as to undercut the etch mask and further narrow the etch mask pattern.

5. The method of claim 1 in which step c. is further extended by the use of both fine-line interferometric lithography to define the extreme sub-micron portions of the pattern and optical lithography is used on an appropriate larger scale to define specific areas to contain said fine-line patterns, thereby eliminating the overall periodicity of the pattern.

6. The method of claim 1, comprising the further step of:

l. oxidizing the quantum-sized Si structure to the point where the lower region of the Si structure is completely isolated from the upper region using the local curvature-dependent oxidation property of Si, thereby forming a complex two-dimensional Si structure on a quantum scale in the upper region.

7. The method of claim 6, wherein portions of the Si substrate are doped prior to fabrication, such that regions showing rapid changes in doping are contained within the upper regions of the complex two-dimensional Si structure.

8. In microelectronic processing, the method of fabricating quantum size (less than 30 nanometer) periodic structures in Si materials, the method comprising the steps of:

a. depositing a thin etch mask layer on a Si substrate;

b. depositing a thin photoresist layer on top of the etch mask layer;

c. exposing the photoresist layer with a periodic pattern of lines using a fine-line interferometric lithography technique optimized to yield the appropriate sub-micron dimension of unexposed photoresist;

d. developing the photoresist to remove the exposed photoresist;

e. etching through the etch mask, whereby the developed photoresist pattern is transferred into the etch mask;

f. removing the remaining photoresist;

g. etching the Si substrate with a highly anisotropic etching process, thereby leaving very narrow quantum-sized Si walls with a very high aspect ratio;

h. etching off the remaining etch mask layer, thereby leaving an all Si structure.

9. The method of claim 8 wherein said etch mask layer of step a. comprises $Si_3N_4$, $SiO_2$, or tungsten.

10. The method of claim 9 wherein the etchant of step e. consists of a $CF_4$ plasma etch process.

11. The method of claim 10 wherein the etching process of step e. is over etched so as to undercut the etch mask and further narrow the etch mask pattern.

12. The method of claim 10 wherein the etch mask layer of step a. is deposited on a <110> Si substrate, the lines of said periodic pattern in step c. are aligned with the {111} Si crystal directions, and the anisotropic etchant of step g. consists of a KOH:H2O solution.

13. The method of claim 8, comprising the further step of:

i. oxidizing the quantum-sized Si-wall structure to the point where the lower region of the Si wails is completely isolated from the upper region of the Si walls using the local curvature-dependent oxidation property of Si, thereby forming single-crystal Si wires on a nm scale in the upper region.

14. The method of claim 13, wherein portions of the Si substrate are doped prior to fabrication, such that regions showing rapid changes in doping are contained within the Si wires.

* * * * *

UNITED STATES PATENT AND TRADEMARK OFFICE
CERTIFICATE OF CORRECTION

PATENT NO. : 5,705,321

DATED : January 6, 1998

INVENTOR(S) : S.R.J. Brueck et al.

It is certified that error appears in the above-identified patent and that said Letters Patent is hereby corrected as shown below:

At Column 1, line 5, insert --This invention was made in the performance of work under a contract with the the U.S. Department of Energy, Contract No. DE-FI0404-93AL83300.--

Signed and Sealed this

Fourteenth Day of April, 1998

Attest:

BRUCE LEHMAN

Attesting Officer

Commissioner of Patents and Trademarks